US012467157B2

(12) United States Patent
Weeden et al.

(10) Patent No.: US 12,467,157 B2
(45) Date of Patent: Nov. 11, 2025

(54) ENCLOSED CRYSTAL GROWTH

(71) Applicant: LUXIUM SOLUTIONS, LLC, Hiram, OH (US)

(72) Inventors: David J. Weeden, Concord, NH (US); Brian J. McAndrews, Brookline, NH (US); Guilford Leroy Mack, III, Manchester, NH (US); Ralph L. Maclean, Jr., Manchester, NH (US)

(73) Assignee: LUXIUM SOLUTIONS, LLC, Hiram, OH (US)

( * ) Notice: Subject to any disclaimer, the term of this patent is extended or adjusted under 35 U.S.C. 154(b) by 231 days.

(21) Appl. No.: 18/323,847

(22) Filed: May 25, 2023

(65) Prior Publication Data

US 2023/0383432 A1 Nov. 30, 2023

Related U.S. Application Data

(60) Provisional application No. 63/365,321, filed on May 25, 2022.

(51) Int. Cl.
*C30B 9/04* (2006.01)
*C30B 29/60* (2006.01)

(52) U.S. Cl.
CPC ................ *C30B 9/04* (2013.01); *C30B 29/60* (2013.01)

(58) Field of Classification Search
CPC ........... C30B 9/04; C30B 29/60; C30B 15/24; C30B 15/34; Y10T 117/1036
See application file for complete search history.

(56) References Cited

U.S. PATENT DOCUMENTS

| | | | | |
|---|---|---|---|---|
| 4,416,723 | A | 11/1983 | Pelts et al. | |
| 8,481,460 | B2 | 7/2013 | Goyal | |
| 9,926,645 | B2 | 3/2018 | Locher et al. | |
| 11,725,304 | B2 * | 8/2023 | Stoddard | C30B 15/14 117/11 |
| 11,761,119 | B2 * | 9/2023 | Stoddard | C30B 15/34 117/209 |
| 2005/0227117 | A1 * | 10/2005 | Locher | C30B 15/30 423/625 |
| 2011/0139064 | A1 | 6/2011 | Kato et al. | |
| 2013/0305981 | A1 | 11/2013 | Kamei et al. | |
| 2017/0342591 | A1 | 11/2017 | Locher et al. | |
| 2021/0214855 | A1 | 7/2021 | Sakano et al. | |

FOREIGN PATENT DOCUMENTS

| | | | |
|---|---|---|---|
| JP | 2006086371 | A | 3/2006 |
| JP | 6025085 | B2 | 11/2016 |
| WO | 2023230243 | A1 | 11/2023 |

OTHER PUBLICATIONS

International Search Report and Written Opinion for PCT/US2023/023554, dated Sep. 15, 2023, 11 pages.

* cited by examiner

*Primary Examiner* — Robert M Kunemund
(74) *Attorney, Agent, or Firm* — Abel Schillinger, LLP; John M. Frank

(57) ABSTRACT

Various single crystals are disclosed including sapphire as well as methods of forming the same. A method of forming a crystalline structure is disclosed as well. The method can include providing a melt in a crucible having a die. The die can include a ventilation opening. The method can further include growing the crystalline structure from the die using an enclosed seed. The single crystals can have desirable geometric properties, including a length greater than a diameter greater than a thickness.

10 Claims, 6 Drawing Sheets

ENCLOSED CRYSTAL GROWTH

CROSS-REFERENCE TO RELATED APPLICATION(S)

This application claims priority under 35 U.S.C § 119(e) to U.S. Provisional Application No. 63/365,321, entitled "ENCLOSED CRYSTAL GROWTH," by David J. WEEDEN et al., filed May 25, 2022, which is assigned to the current assignee hereof and is incorporated by reference in its entirety.

BACKGROUND

Field of the Invention

The present invention is generally drawn to ceramics and method of production and in particular, to single crystal components, especially plugged tubes, methods for forming such components, and processing equipment used in connection with the formation of single crystal components.

Description of the Related Art

Single crystal sapphire, or α-alumina, is a ceramic material having properties that make it attractive for use in a number of fields. For example, single crystal sapphire is hard, transparent, and heat resistant, making it useful in, for example, optical, electronic, armor, and crystal growth applications. As such, single crystals such as sapphire have been a material of choice for demanding, high performance optical applications, including various military and commercial applications.

While certain demanding high performance applications have taken advantage of single crystal sapphire, its implementation has not been widespread partly due to cost and size limitations due to forming technologies. In this regard, single crystal sapphire in the form of non-traditional geometric shapes, such as plugged tubes, is one geometric configuration that holds much industrial promise. However, scaling size while controlling processing conditions has been a challenge in the industry. For example, processing equipment has not been adequately developed for the repeatable production of plugged tubes, and additionally, processing techniques have not been developed for reliable manufacture.

In light of the foregoing, the industry continues to innovate geometric shapes that can be produced in a cost-effective manner, such that improved size and reduced cost enable the implementation of these geometric shapes in various applications that, to date, have not been exploited. In addition, there is a particular demand for large-sized sapphire plugged tubes.

SUMMARY

According to a first aspect of the present invention, a method of forming a crystalline tube is provided. The method can include providing a melt in a crucible having a die, where the die comprises, a ventilation opening; and growing the crystalline tube from the die using an enclosed seed.

According to another aspect, a method of forming a crystalline tube is disclosed. The method can include providing a melt in a crucible having a die; contacting a crystalline seed to the melt; and growing the crystalline tube from the die using the crystalline seed, wherein the crystalline seed becomes the cover for the crystalline tube.

According to yet another aspect, a crystalline tube is disclosed. The crystalline tube can include a body with a first crystalline structure; and a cover with a second crystalline structure, where the first crystalline structure is the same as the second crystalline structure.

DETAILED DESCRIPTION

According to various embodiments of the present invention, new sapphire single crystals, a crystal growth apparatus, particularly, an EFG growth apparatus, and methods for growing single crystals are provided. Description of these various embodiments begins with a discussion of the EFG growth apparatus 100 illustrated in FIGS. 1 and 2. As used herein, the term EFG refers to the Edge-Defined-Film-Fed Growth technique, a technique that is generally understood in the industry of single crystal fabrication, and particularly includes EFG as applied to sapphire single crystal growth. However, the growth process described below can be utilized to grow other crystalline materials and in particular those materials that utilize EFG, such as gallium oxide.

"Single Crystal Sapphire" means $\alpha$-$Al_2O_3$, also known as corundum, which is primarily single crystal.

"C-plane single crystal sapphire" refers to substantially planar single crystal sapphire, the c-axis of which is substantially normal (+/−10 degrees) to the major planar surface of the material. Typically, the C-axis is less than about 1 degree from the major planar surface. See FIG. 2. The "sapphire C-plane" is known in the art and is typically the sapphire plane having a Miller index of 0001 and d spacing of 2.165 Angstroms.

"Ventilation opening" refers to an opening that allows a relief of pressure within an interior of a structure and that allows an exchange of air from the interior of the developing structure to the exterior of the structure.

Figure 1A:
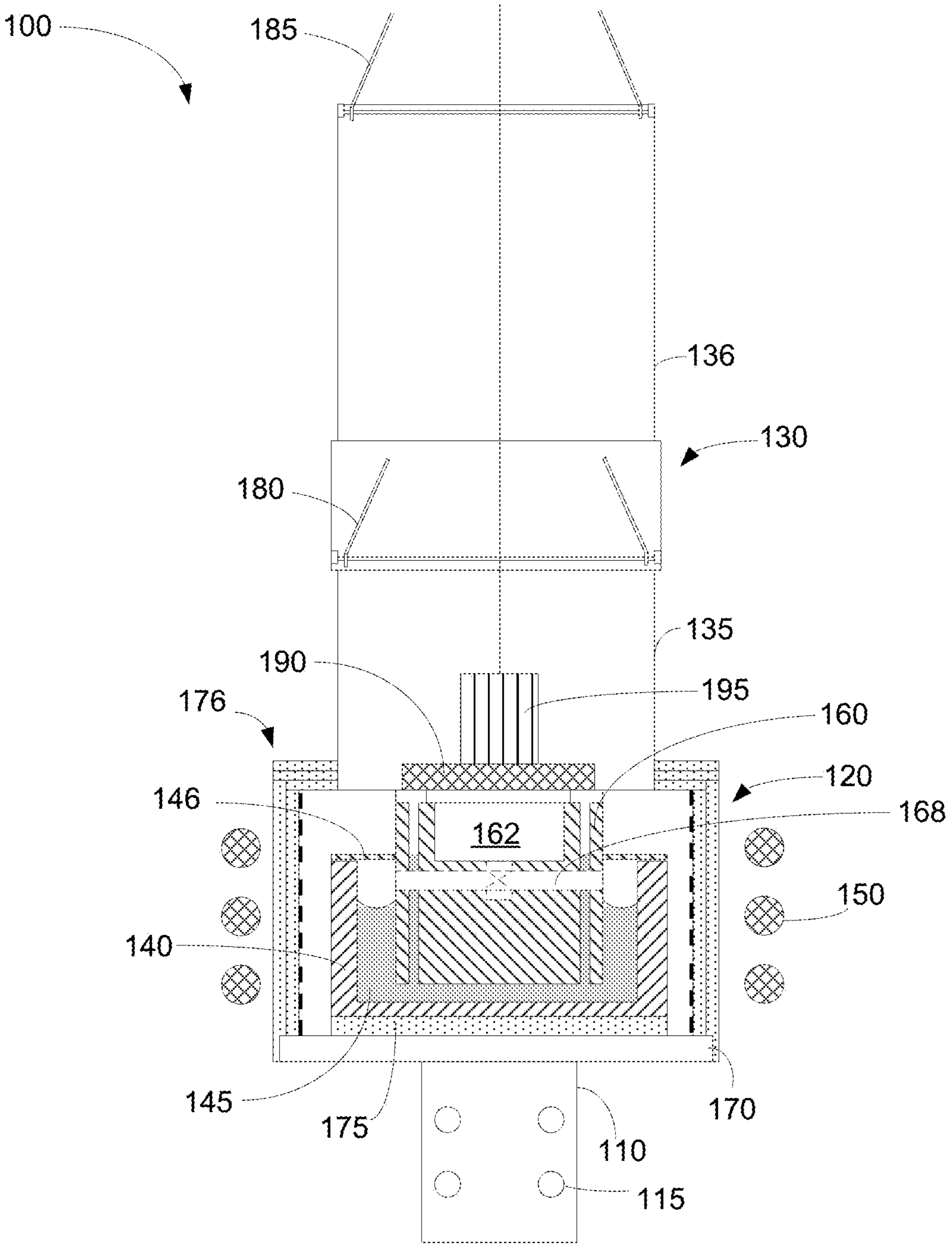
FIG. 1A shows a side schematic view of a crystal growth apparatus at the beginning stages of growth, according to an embodiment of the present disclosure.
Figure 1B:
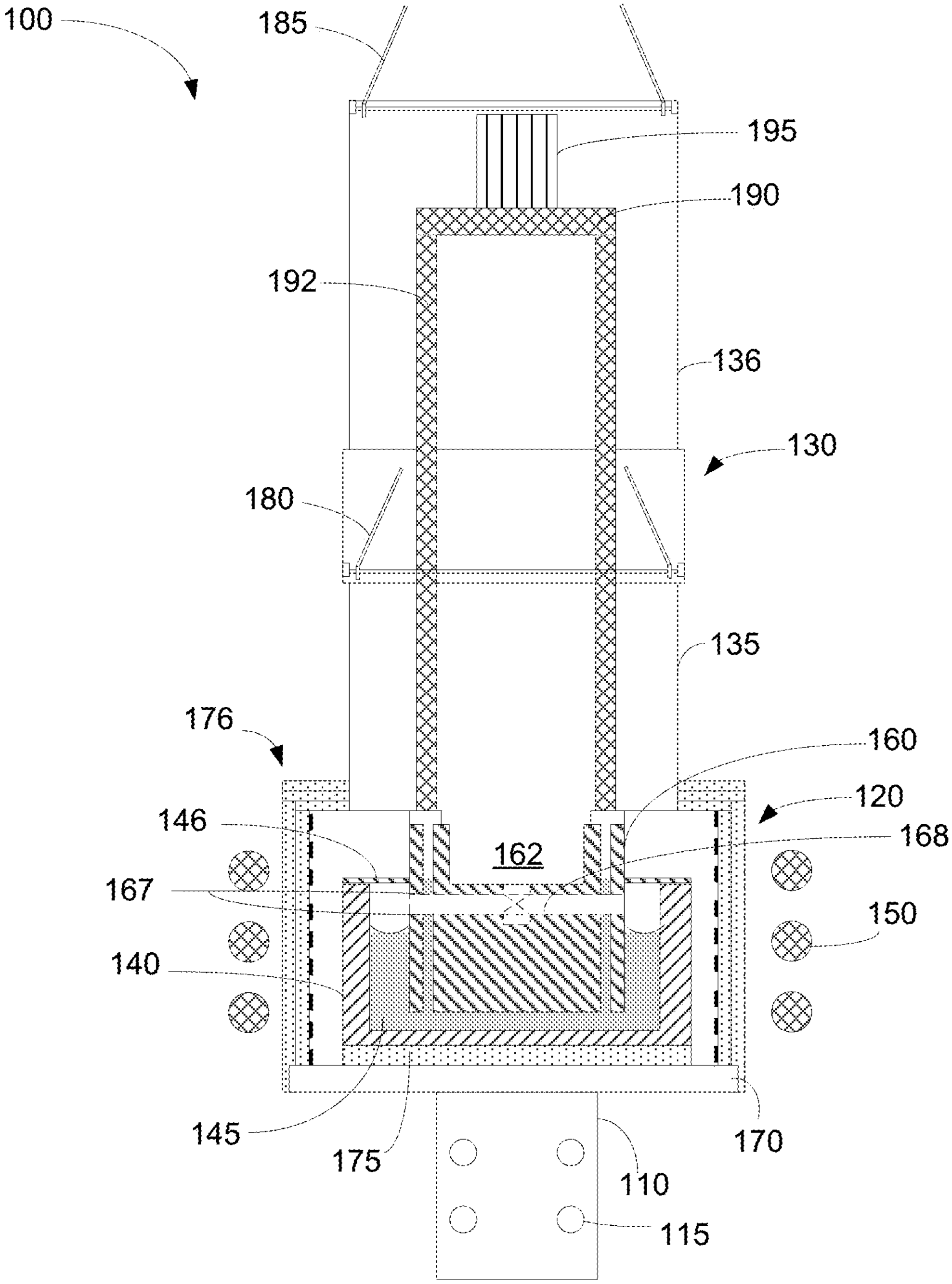
FIG. 1B shows a side schematic view of a crystal growth apparatus at a more advanced stage of growth, according to an embodiment of the present disclosure.

Turning to FIGS. 1A and 1B, EFG growth apparatus 100 includes several main components, including a pedestal 110 supporting melt fixture 120, which is open to and communicates with afterheater 130. Pedestal 110 is generally provided to mechanically support the apparatus while thermally isolating the melt fixture 120 from the work surface on which the EFG apparatus is provided, to attenuate heat transmission from the melt fixture 120 to the work surface. In this context, the pedestal 110 is generally formed of a refractory material capable of withstanding elevated temperatures on the order of 2,000° C. While various refractory metals and ceramics may be utilized, graphite is particularly suited for the pedestal 110. Vent holes 115 are provided in pedestal 110 to further improve thermal isolation.

Turning to melt fixture 120, crucible 140 is provided for containing the melt 145 that is utilized as the raw material for forming the single crystal. In the context of sapphire single crystals, the raw material is a melt 145 from alumina raw material. However, other raw materials can be utilized if a different crystal is formed. The crucible 140 is typically formed of a refractory metal that is adapted to be heated through exposure to the field generated by an inductive heating element 150. The crucible is desirably formed of molybdenum (Mo) although other materials may be utilized such as tungsten, tantalum, iridium, platinum, nickel, and in the case of growth of silicon single crystals, graphite. More generally speaking, the materials are desired to have higher melting point than the crystal being drawn, should be wet by the melt, and not react chemically with the melt. The inductive heating element 150 illustrated is an RF coil, having multiple turns forming a helix. Within the crucible 140, a die 160 is provided, which extends into the depth of the crucible 140. In one embodiment, the die 160 can have a center channel 162 that is open through a crucible lid 146 and generally exposed to afterheater 130. In one embodiment, the die 160 can include a ventilation opening 168. The crucible 140 is closed off by crucible lid 146. The die 160 is alternatively referred to as a "shaper" in the art and is described in more detail with respect to FIG. 2.

The melt fixture 120 is generally mechanically supported by a support plate 170 overlying pedestal 110. Thermal insulation is provided by bottom insulation 175 as well as insulation layers 176 generally surrounding the lateral sides and top of the melt fixture 120. The bottom insulation 175 and the insulation layers 176 may be formed of graphite felt, for example, although other insulation materials may be utilized such as low conductivity rigid graphite board (such as Fiberform from FMI Inc.); other materials are, when thermodynamically compatible, alumina felt and insulating materials; zirconia felt and insulation; aluminum nitride, and fused silica (quartz).

The next major structural component of the EFG growth apparatus 100 is the afterheater 130 which can include a lower compartment 135 and an upper compartment 136. The upper and lower compartments are separated from each other by an isolation structure 180. In the particular embodiment shown in FIGS. 1A and 1B, the isolation structure 180 illustrated is formed by lower isolation doors. For illustration, the doors are in the open position; however, it can be understood that the isolation doors can be both in the open position, both in the closed position, or one open and the other closed. A second isolation structure is also provided to separate the afterheater 130 from the external environment. In the embodiment shown in FIGS. 1 and 2, the upper isolation structure is formed by upper isolation doors 185.

While a more detailed discussion is provided below regarding the growth process and operation of the EFG growth apparatus, the process generally calls for lowering a seed crystal 190 through the afterheater 130 to make contact with the liquid that is present at the top of the die 160, exposed through the crucible lid 146. In the embodiment illustrated, the afterheater is passive, that is, does not contain active heating elements. However, the after heater may be active, incorporating temperature control elements such as heating elements. After initial growth, the seed crystal is raised and the growing single crystal spreads to elongate the walls 192 forming a plugged structure, having a hollow center. In one embodiment, the plugged structure is a tube. The enclosed structure is not machined to include a hollow core. Instead, as the enclosed structure is hollow as the length of the walls of the structure are pulled and grown during processing. The single crystal is then raised through the afterheater 130, first through lower compartment 135, and then into upper compartment 136. As the single crystal structure translates into the upper compartment 136, the isolation doors 180 automatically close behind, thereby isolating the upper compartment 136 and the single crystal structure from the lower compartment 135 and melt fixture 120.

The isolation structure in the form of the lower insulation doors 180 provides several functions. For example, in the case of catastrophic failure of crystal tube during cooling, the resulting debris is prevented from impacting the relatively sensitive melt fixture 120. In addition, the isolation doors 180 may provide thermal insulation, to provide a controlled cooling environment in the upper compartment 136, thereby controlling cooling rate in the upper compartment 136. In some embodiments, single crystal sapphire exhibiting little or no polycrystallinity can be produced by subjecting the crystal to a higher rate of cooling immediately after formation from a melt and subsequently reducing the rate of cooling as the crystal advances through the production process. The rate of cooling may be controlled, at least partially, by the thermal gradient in the apparatus and/or by the rate of growth of the crystal.

Figure 2:
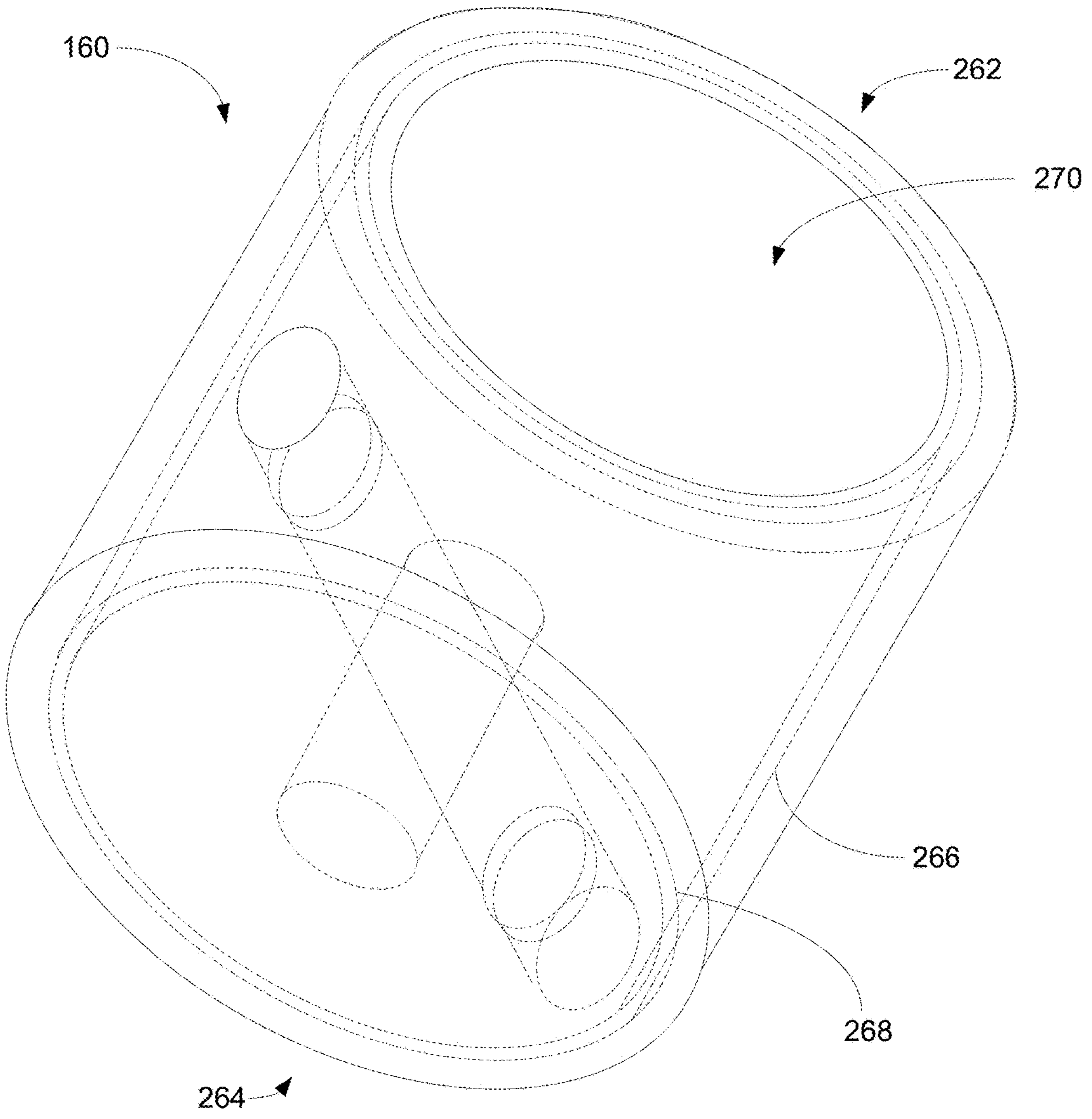
FIG. 2 shows a schematic view of a die used in the system of FIGS. 1A and 1B, according to an embodiment of the present disclosure.

Turning to FIG. 2, various features of die 160 are illustrated. As shown, the die 160 can include a first side 262 and a second side 264 opposite the first side 262. The die 160 can also include conduits 266, ventilation pass-throughs 268, and opening 270. In one embodiment, the ventilation pass-throughs 268 can be ventilation openings. The die 160 can include an internal area that can be accessed through the opening 270. In one embodiment, the opening 270 can be on the first side 262. In operation, the first side 262 can face the seed 190, as seen in FIGS. 1A and 1B. In one embodiment, the conduits 266 can connect to a circumferential opening at the first side 262 of the die 160. In one embodiment, the conduits 266 can include more than one conduit. In another embodiment, as seen in FIG. 2, the conduits 266 can be one conduit that circumferentially is within the body of the die 160. In such an embodiment, where the conduit 266 contacts the pass through 268, spacers 167 block the melt from entering the pass through 268 from the conduit 266. In one embodiment, the conduits 266 can contact the melt. In one embodiment, the conduits 266 can run along the length of the body of the die 160. In operation in one embodiment, the ventilation pass-throughs 268 can be above the melt 145, as seen in FIGS. 1A and 1B. In another embodiment, the ventilation pass-throughs 268 can connect to a conduit. In another embodiment, the ventilation pass-throughs 268 can connect to a conduit and can also be below the melt 145. In another embodiment, the ventilation pass-throughs 268 can include a horizontal portion and a vertical portion. The horizontal portion can run parallel to the first side 262 and the vertical portion can run orthogonal to the first side 262. In one embodiment, the horizontal portion can go all the way through the die 160, including two openings towards the exterior environment, as seen in FIG. 2. In one embodiment, the horizontal portion can run on along a line corresponding to a diameter of die 160. In another embodiment, the horizontal portion can connect the inside environment of the opening 270 of the die 160 to the outside environment of the die 160 through a surface that is orthogonal to the first side 262. In another embodiment, the horizontal portion can have an opening that is unilateral. In one embodiment, the ventilation pass-through 268 could be L-shaped. In another embodiment, the ventilation pass-through 268 could be a single pass-through from the second surface 264 to the interior area of the opening 270. In one embodiment, the ventilation pass-through 268 can be closer to the second side 264 than the first side 262. In another embodiment, the ventilation pass-through 268 can be closer to the first side 262 than the second side 264. In yet another embodiment, the ventilation pass-through 268 can be equidistant from the first side 262 as to the second side 264. In one embodiment, the conduits 266 is isolated from the ventilation pass-throughs 268. In one embodiment, the die 160 can be cylindrical. It can be imagined that the system 100, utilizes a die without a ventilation opening but instead, the system 100 includes a ventilation opening—to relieve pressure and negative pressure within the developing structure—in another location, such as in the conduit while maintaining a closed system. In another embodiment, the die 160 can be of any geometric shape, including but not limited to square, rectangular, polygonal, hexagonal, triangular, and more.

Figure 5:
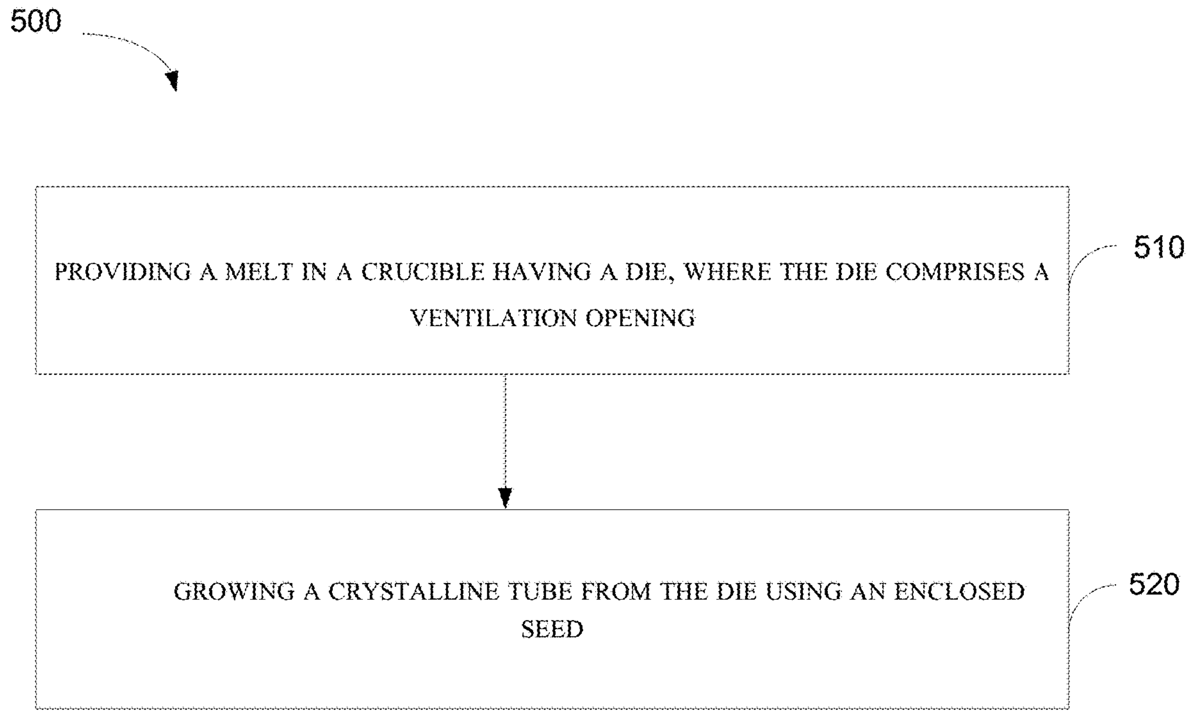
FIG. 5 shows a method of growing a crystal utilizing the apparatus shown in FIGS. 1A, 1B, and 2, according to an embodiment of the present disclosure.

Now focusing on operation of the EFG growth apparatus 100, typically crystal growth begins, as seen in the method 500 of FIG. 5, with formation of a melt 145 in the crucible 140, at operation 510. The die 160 can be within the crucible 140 containing the melt 145, as disclosed in operation 510. Here, the crucible is filled with a feed material, $Al_2O_3$ in the case of sapphire. As the melt 145 is heated to liquid form, the melt 145 can go through the conduits 266 towards the first side 262 of the die 160. The melt is initiated and maintained by inductive heating at a temperature of about 1950° C. to about 2200° C., by energizing inductive heating element 150 having a plurality of inductive heating coils. Heating by induction is affected by heating of the crucible 140, transmitting thermal energy into the material contained therein. The melt 145 wets the die 160, forming a layer of liquid at the surface of the die 160.

After formation of a stable melt 145 in the crucible 140, the seed crystal 190 is lowered through the afterheater 130, to contact the liquid that is present on the first side 262 of the die 160, as seen in FIG. 1A. After contact of the seed crystal with the melt 145 at the die opening, the liquid film of the melt 145 extending from the die 160 to the seed 190 is observed and temperature gradient (discussed below) are adjusted to reach a film height, such as on the order of 0.3 to 2.0 millimeters. As the seed crystal is slowly raised, the walls 192 of the tube are extended to form a hollow crystalline tube, as seen in FIG. 1B. The seed crystal is slowly raised such that upon raising the crystal into the lower compartment of the afterheater 135 the lower temperature causes crystallization of the liquid melt, forming a single, plugged, hollow crystal tube, as seen in FIG. 1B. Accordingly, the hollow crystalline tube is grown from the die using an enclosed seed, as seen at operation 520. The seed is enclosed by forming a seal with the melt 145 such that as the walls 192 of the tube grow and the seed 190 is raised, the seed 190 and walls 192 form a unitary body that make up the crystalline tube. The seed crystal is generally raised or pulled within a range of about 3 to 30 centimeters per hour, such as within a range of 3 to 15 centimeters per hour or 3 to 10 centimeters per hour. Once assuring that the initial growth of the plugged end is desirable, the balance of the hollow tube is grown by lowering the pull speed to be on the order of 0.1 cm/hr to about 20 cm/hr, often times within a range of about 0.1 cm/hr to about 10 cm/hr, more particularly, 0.5 cm/hr to 5 cm/hr. Additionally, the temperature may be lowered to be on the order of 10° C. to 100° C. lower, such as 10° C. to 50° C. lower than the initial starting temperature of the process.

As the seed 190 with the enclosed crystal structure is pulled upward, a negative pressure can build since the structure is plugged or sealed with the seed. The negative pressure builds since there are no openings or perforations between the seed and growing walls of the hollow structure. Without the die 160, as disclosed, the enclosed structure would eventually collapse giving way to the negative pressure. Such pressure is especially noticeable when the length of the structure is greater than the thickness of the body or walls 192 of the structure. In one embodiment, the length of the tube is greater than the outer diameter of the tube. Advantageously, the ventilation pass-throughs 268 of the die 160 equalize the negative pressure that would otherwise collapse the sides of the crystal structure. Accordingly, an enclosed crystal structure can be grown where the length is greater than the outer diameter and where the outer diameter is greater than the thickness of the crystal tube. In one embodiment, the thickness of the body of the tube can be equal to the difference between the outer diameter of the tube and the inner diameter of the tube. In other words, an enclosed crystal structure can be grown that would overcome the vacuum effect seen with a structure having a length that is greater than the thickness.

In one embodiment, the outer diameter can be greater than 0.5 inches, such as greater than 0.6 inches, such as greater than 1 inch, such as greater than 1.5 inches, such as greater than 3 inches, such as greater than 5 inches. In another embodiment, the outer diameter is no greater than 10 inches. In one embodiment, the length is greater than 1 inch, such as greater than 2 inches, such as greater than 5 inches, such as greater than 10 inches. In one embodiment, the length is no greater than 20 inches. In one embodiment, the thickness is greater than zero but less than 1 inch. In one embodiment, the thickness is between zero and 20 mm, such as between 1 mm and 15 mm, such as between 2 mm and 10 mm. The die has a length l, a width w, and a thickness t, wherein an aspect ratio defined as l:w is not less than 2:1. According to certain embodiments, the aspect ratio is not less than 3:1, such as not less than 4:1. While the cross-sectional shape of the crucible 20 is generally circular, other embodiments may be rectangular, oval, hexagonal, square, triangular, or polygonal, while still maintaining the foregoing aspect ratio features.

Figure 3:
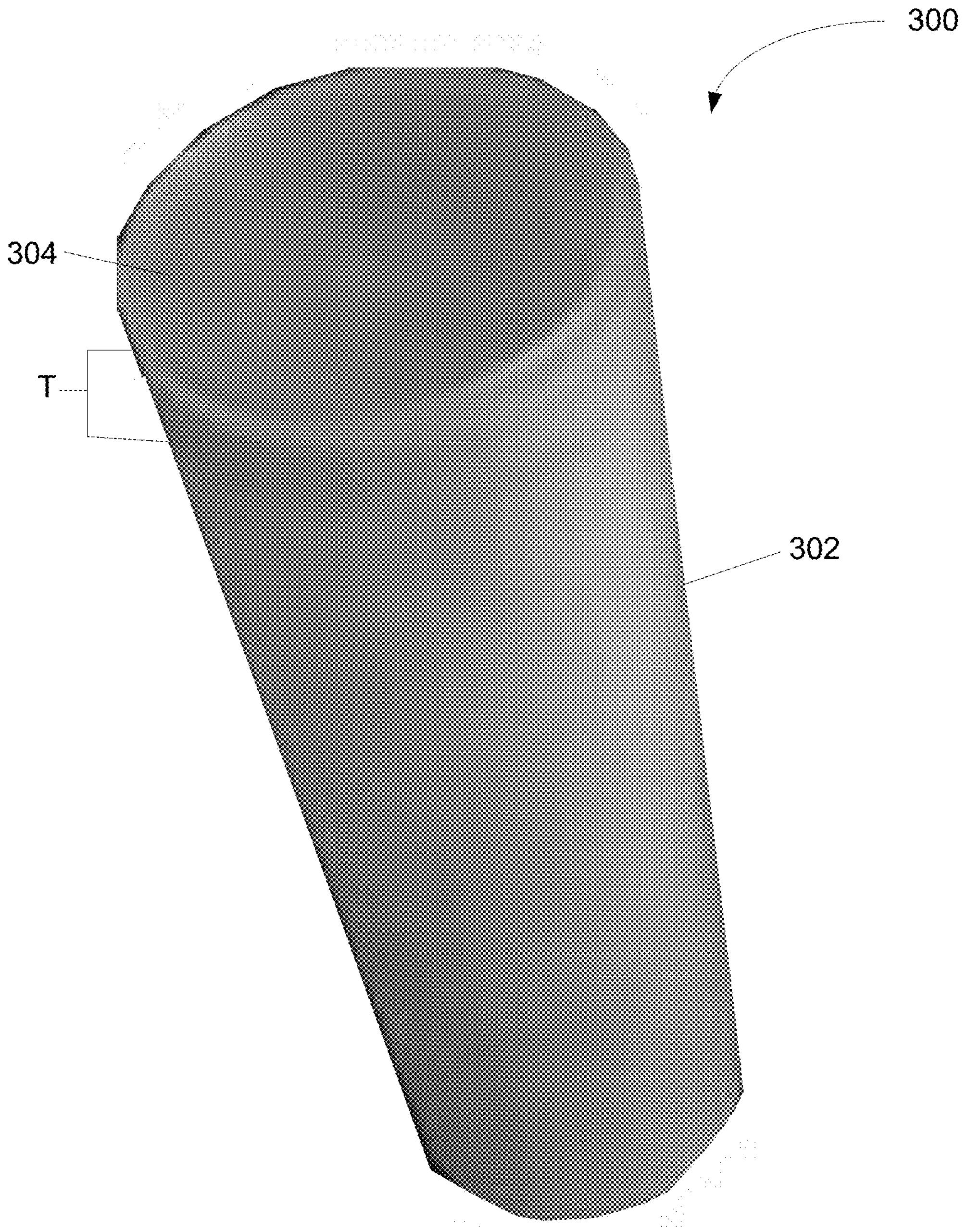
FIG. 3 shows a schematic of an as-grown plugged tubular single crystal.
Figure 4A:
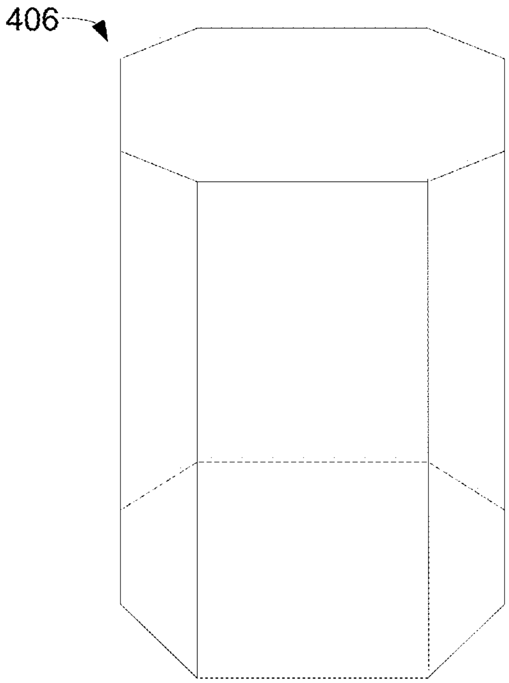
FIGS. 4A-4C show schematics of grown plugged crystalline structures with varied geometries, according to an embodiment of the present disclosure.
Figure 4B:
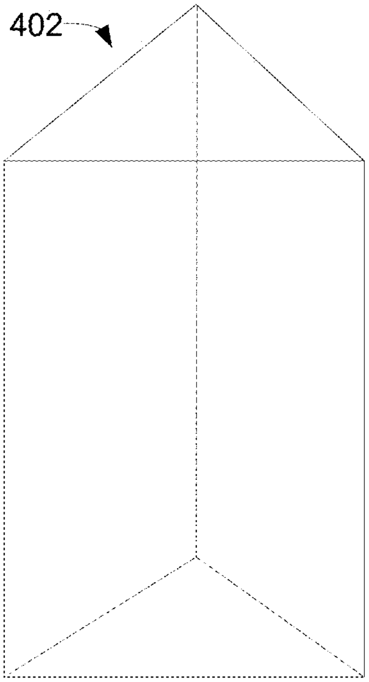
Figure 4C:
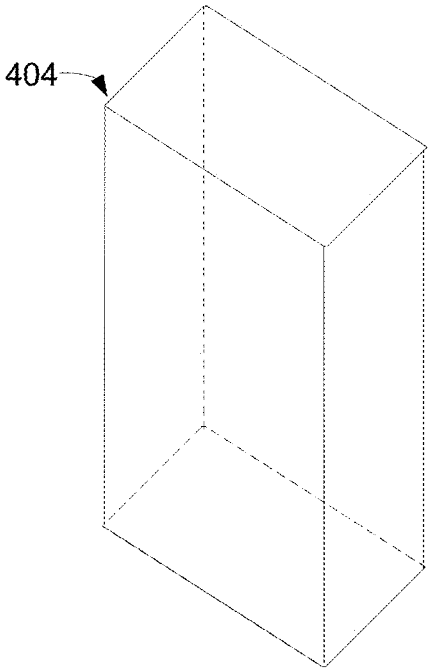

Turning to the full-length plugged single crystal structure 300 shown in FIG. 3, the single crystal 300 includes a main hollow body 302 and a plug or cover 304, wherein the transition from the cover 304 to the main body 302 is labeled T. As shown in the embodiment of FIG. 3, the enclosed single crystal structure can be a tube. The single crystal structure 300 is a unitary structure made from a single piece. In one embodiment, the structure 300 can be monolithic. The transition from the cover 304 to the main body 302 during growth happens along transition zone T as labeled. As exemplified by the growth method described throughout the disclosure, the transition zone T contains the same internal crystal structure as the rest of the tube. In other words, the transition zone T is not bonded after the growth is complete. In fact, the seed 190 then becomes the cover 304 of the crystalline tube 300. In one embodiment, the transition zone T can be non-perforated. The cover 304 and the walls of the crystalline tube 300 are a unitary body without seams at the transition zone T. The cover 304 and the walls of the crystalline tube 300 have a unitary crystalline matrix. A person of ordinary skill in the art will appreciate that the single crystal can have minor defects. The first part of the growth is located at the transition zone and the rest of the tube is pulled from that transition zone T. The seed 190 can be in any geometric shape. The seed can determine the shape of the crystalline tube and thus, any geometric shaped tube can be made. As seen in FIGS. 4A-4C, an enclosed triangular shaped structure 402, an enclosed rectangular shaped structure 404, and an enclosed polygonal shaped structure 406 can be formed. Additional geometric shapes, not shown, are also possible. In one embodiment, two different sized tubes can be grown from a plugged disk in between the two tubes. In one embodiment, two different shaped tubes can be grown from a plugged disk in between the two tubes. In another embodiment, two different sized tubes and different shaped tubes can be grown from a plugged disk in between the two tubes. Advantageously, a covered structure can be grown without having to drill out a core from a solid fiber or tube, as is typically done in the industry currently.

In one embodiment, the cover 304 is the enclosed seed 190 seen in FIG. 1. In one embodiment, the cover 304/seed 190 is a c-plane sapphire disc or substrate with the C-axis orientation substantially perpendicular to a longitudinal axis of a die opening. In another embodiment, the cover 304/seed 190 is an a-plane sapphire disc or substrate. In yet another embodiment, the cover 304/seed 190 is a gallium oxide substrate. In another embodiment, the cover 304/seed 190 is any crystal used for growth in EFG.

Following the drawing and cool down of the single crystal, machining operations can be used to remove the seed puller 195 from the formed crystalline tube. Additional machining may be done on the exterior surface of the tube to smooth out any bumps for commercial use. Accordingly, grinding, lapping, polishing and the like, or bulk material removal/shaping such as wire sawing or cleaving and the like may be utilized to manipulate the single crystalline tube.

As the grown tube already contains the cover, additional machining is not necessary, especially in the transition zone. Accordingly, the internal surface of the cover and body can remain as grown. Turning to the single crystal itself, the single crystal can be in the form of alumina single crystal (sapphire). Further, the single crystal typically has a relatively confined variation in thickness, having a variation not greater than about 0.2 cm. Here, variation in thickness corresponds to the maximum thickness variation along a segment spanning the width of the main body of the single crystal tube. Ideally, the maximum thickness variation corresponds to substantially the majority of all width segments along the main body, generally denoting a maximum thickness variation along the majority of main body of the single crystal.

Embodiment 1. A method of forming an enclosed crystalline structure is disclosed. The method can include providing a melt in a crucible having a die, where the die comprises a ventilation opening; and growing the crystalline structure from the die using a seed to form an enclosed crystalline structure.

Embodiment 2. A method of forming an enclosed crystalline structure is disclosed. The method can include providing a melt in a crucible having a die; contacting a crystalline seed to the melt; and growing a body of the crystalline structure from the die using the crystalline seed, wherein the crystalline seed becomes a cover for the enclosed crystalline structure.

Embodiment 3. An enclosed crystalline structure is disclosed. The enclosed structure can include, a body having a length of greater than 2 inches; and a cover, wherein the body and cover are a single crystal.

Embodiment 4. The crystalline structure of embodiment 3, where the first crystalline structure comprises a native interior and exterior surface, and where the interior surface is unmodified from growth.

Embodiment 5. The crystalline structure of embodiment 3, where the cover is not bonded to the body of the crystalline structure.

Embodiment 6. The crystalline structure of embodiment 5, where a transition zone between the cover and the body of the crystalline structure does not contain seams.

Embodiment 7. The crystalline structure of embodiment 3, where the body of the crystalline structure is grown from the cover of the crystalline structure.

Embodiment 8. The method or crystalline structure of embodiment 7, where the width is greater than 0.5 inches.

Embodiment 9. The method or crystalline structure of any one of the preceding embodiments, where the crystalline structure is hollow.

Embodiment 10. The method or crystalline structure of any one of the preceding embodiments, where the crystalline structure is a single crystalline structure.

Embodiment 11. The method or crystalline structure of any one of the preceding embodiments, where the body is not machined.

Embodiment 12. The method or crystalline structure of any one of the preceding embodiments, where the crystalline structure comprises a material selected from the group of sapphire.

Embodiment 13. The method or crystalline structure of any one of the preceding embodiments, where the crystalline seed is a circular substrate.

Embodiment 14. The method or crystalline structure of any one of the preceding embodiments, where the crystalline seed is polygonal substrate.

Embodiment 15. The method or crystalline structure of any one of the preceding embodiments, where the crystalline structure is square.

Embodiment 16. The method or crystalline structure of any one of the preceding embodiments, where the crystalline structure is hexagonal.

Embodiment 17. The method of embodiment 1, where the ventilation opening goes through the body of the die from one end to another end along a diameter of the die.

Embodiment 18. The method of embodiment 17, where the ventilation opening comprises a vertical portion and a horizontal portion.

Embodiment 19. The method of embodiment 18, where the horizontal structure goes through the body of the die from one end to another end and the vertical structure intersects the horizontal structure.

Embodiment 20. The method of embodiment 19, where the vertical structure has an end that connects to an opening of the die.

Embodiment 21. The method or crystalline structure of any one of the preceding embodiments, where the crystalline structure has a length, a width, and a thickness, where the length>diameter>thickness.

Embodiment 22. The method of embodiment 1, where the enclosed crystalline structure is a tube.

Examples

Example 1, an enclosed crystal having dimensions 39.4 mm outer diameter (OD)×33.4 inner diameter (ID) structure. The following process flow was used to form Example 1.

a. Set up furnace with growth components: crucible, die, shields, and insulation package.

b. Purge chamber for 1 hour at 240 scfm (standard feet/minute) Argon.

c. Turn on power 50 kW supply.

d. Ramp power to achieve a temperature set point of 1950° C.

e. Manually adjust temperature until melting ($T_m$) is observed.

f. Manually adjust temperature from $T_m$ to $T_m$+60° C.

g. Start feeder and add 350 g feed material into crucible.

h. Allow melt to stabilize for 0.25 hour.

i. Lower seed to within 1.5 mm of the die and allow temperature to stabilize for 5 minutes. After time is complete lower seed until seed contacts die and there is complete contact between the seed and die.

j. Adjust temperature so that approximately 0.4 mm of liquid film separates seed crystal and die ($T_n$).

k. Start upward translation of seed puller at 75 mm/hr.

l. Grow transition zone of crystal for 35 mm, adjust temperature to lower meniscus to allow the structure OD to get closer to the die OD.

m. Adjust temperature and lower pull speed to 50 mm/hr until stable growth is achieved.

n. When the target length of the crystal has been reached, pull the crystal free of die by increasing pull rate so structure separates from die by 12 mm.

o. Anneal crystal at a rate of 152 mm/hr for 254 mm and power down furnace.

Through use of various features of the embodiments of the present invention, such as utilization of a ventilated die, plugged single crystalline structures having the foregoing desirable geometric and mass features such as minimum width, thickness, and thickness variation features may be successfully formed. The above-disclosed subject matter is to be considered illustrative, and not restrictive, and the appended claims are intended to cover all such modifications, enhancements, and other embodiments, which fall within the scope of the present invention. For example, while certain embodiments focus on growth of large-sized sapphire, other single crystals may be fabricated utilizing the process techniques described herein. Thus, to the maximum extent allowed by law, the scope of the present invention is to be determined by the broadest permissible interpretation of the following claims and their equivalents and shall not be restricted or limited by the foregoing detailed description.

What is claimed is:

1. A method of forming an enclosed crystalline structure, the method comprising:

providing a melt in a crucible having a die, wherein the die comprises a ventilation opening; and growing the crystalline structure from the die using a seed to form an enclosed crystalline structure.

2. The method of claim 1, wherein the ventilation opening goes through the body of the die from one end to another end along a diameter of the die.

3. The method of claim 2, wherein the ventilation opening comprises a vertical portion and a horizontal portion.

4. The method of claim 3, wherein the horizontal structure goes through the body of the die from one end to another end and the vertical structure intersects the horizontal structure.

5. The method of claim 4, wherein the vertical structure has an end that connects to an opening of the die.

6. The method of claim 1, wherein the crystalline structure is hollow.

7. The method of claim 1, wherein the crystalline structure is a single crystalline structure.

8. The method of claim 1, wherein the body is not machined.

9. The method of claim 1, wherein the crystalline structure comprises sapphire.

10. A method of forming an enclosed crystalline structure, the method comprising:

providing a melt in a crucible having a die, wherein the die comprises a ventilation opening;

contacting a crystalline seed to the melt; and growing a body of the crystalline structure from the die using the crystalline seed, wherein the crystalline seed becomes a cover for the enclosed crystalline structure.

* * * * *